US007948270B1

(12) United States Patent
Evans et al.

(10) Patent No.: US 7,948,270 B1
(45) Date of Patent: May 24, 2011

(54) SYSTEM AND METHOD FOR LEVEL TRANSLATION IN SERIAL DATA INTERFACE

(75) Inventors: William Pierce Evans, Catonsville, MD (US); Adrian Leuciuc, Frederick, MD (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 12/648,756

(22) Filed: Dec. 29, 2009

(51) Int. Cl.
*H03K 19/0175* (2006.01)
*H03K 5/00* (2006.01)
*G06F 7/38* (2006.01)

(52) U.S. Cl. ............... 326/82; 326/63; 327/93
(58) Field of Classification Search ........... 326/63, 326/68, 80–82; 327/93–96
See application file for complete search history.

(56) References Cited

U.S. PATENT DOCUMENTS

| | | | | |
|---|---|---|---|---|
| 6,147,522 A | * | 11/2000 | Rhode et al. | 327/93 |
| 6,184,726 B1 | * | 2/2001 | Haeberli et al. | 327/96 |
| 6,856,169 B2 | * | 2/2005 | Frans et al. | 326/82 |
| 7,019,576 B1 | * | 3/2006 | Sancheti et al. | 327/261 |
| 7,049,848 B2 | * | 5/2006 | Brooks et al. | 326/68 |
| 7,417,462 B1 | * | 8/2008 | Wong et al. | 326/82 |
| 7,659,745 B1 | * | 2/2010 | Wong et al. | 326/82 |

* cited by examiner

*Primary Examiner* — Rexford N Barnie
*Assistant Examiner* — Crystal L Hammond
(74) *Attorney, Agent, or Firm* — Rosenberg, Klein & Lee

(57) ABSTRACT

The serial interface operable, for example, to facilitate high speed differential data transfer between integrated circuits provides level shifting of an incoming data signal using a switched capacitor technique which level shifts the common mode voltage with minimal attenuation and minimal reduction of bandwidths. The serial interface also includes a DC offset correction loop of the input data receiver path. The level shifting circuit operates by sensing the incoming common mode voltage of a differential data signal with a resistor divider and sampling the difference between the measured input common mode voltage and desired input differential voltages generated by a differential DAC in the DC offset correction loop on two small capacitors. The small capacitors are switched across larger in-signal-path capacitors cyclically, so that over time a charge will build up to give the desired level shift to shift the common mode voltage of the incoming signal to the level tolerable by low voltage high speed transistors in the receiving integrated circuit.

21 Claims, 5 Drawing Sheets

SYSTEM AND METHOD FOR LEVEL TRANSLATION IN SERIAL DATA INTERFACE

BACKGROUND OF THE INVENTION

The present invention is generally directed to a system and method for level translation in a serial data interface. More specifically, the present invention is directed to a system and method for providing voltage level translation in a serial data interface with minimal signal attenuation and bandwidth reduction. The subject system and method provide for translation of common mode voltage to enable safe differential serial data transfer between integrated circuits, even in high speed environments, without adverse effect upon the transferred signal.

With the many advances in the electronics industry, high speed differential serial data transfer between integrated circuits has become commonplace. Many of those same advances, however, require ever more stringent control over various operational parameters, not the least of which is the level of common mode voltage that certain low voltage devices may safely tolerate. Sensitivities to common mode voltage, the average voltage level of differentially paired signals, have heightened considerably with semiconductor processing technologies increasingly yielding thinner oxide devices.

Serial communication involves the process of sending data one bit at a time sequentially, over a communication channel or computer bus. Among other things, serial interfaces minimize the number of input/output pins on integrated circuits (IC's) and reduce the wiring interconnects required, thereby decreasing the cost of IC's. Examples of such low-cost serial interfaces used to reduce the number of pins in IC's, include SPI, I²C, and 1-Wire links.

A number of standards have been generated over the years to define data rates and signal levels carried by these serial links (buses). Such serial interface standards require DC coupling between integrated circuits to allow for indeterminately long strings of 1's and 0's. Notably, some of the standards reflect earlier technologies requiring higher supply voltages (for example, 1.8V, 2.5V, or 3.3V) than may be acceptable for certain technologies today. The thinner oxide transistor devices available now, especially for high speed applications, offer gate oxide thickness in the 90 nm, 65 nm, 45 nm range and below. These devices can safely tolerate common mode voltages Vcm up to about 1 V, which is significantly less than the Vcm levels in signals generated by earlier integrated circuit technologies. Interface measures are necessary to ensure that the Vcm levels applied to receiving circuits containing such thin oxide transistor devices are translated to sufficiently low levels that they do not cause harm.

Several approaches have been taken in the industry to address this problem of common mode voltage incompatibility. One often used approach is the inclusion of an AC coupling capacitor in each differential signal line, so that the non-varying portion of an incoming signal on the line is filtered out. An obvious drawback of this approach is that the coupling capacitors prevent the passage of DC voltage levels. An additional drawback is that it requires at least two external components for each pair of differential serial lines. Since the number of serial lines on an integrated circuit may be quite high, the number of external components may also become quite high, excessively so.

Another known approach to addressing the problem of common mode voltage incompatibility is to include in the receiver integrated circuit an input stage containing thicker oxide transistors having higher voltage tolerance. Such high voltage transistors, however, tend to be considerably slower than the thinner oxide transistors required for high speed applications. Receiver circuits integrated with these higher voltage input stages may not even operate when their serial buses receive very high speed data streams in the range, for instance, of 10 Gbit/sec. An additional drawback of this approach is that receiver circuits with the thicker oxide transistors are powered by higher supply voltages which lead to greater power dissipation.

Yet another known approach to addressing the common mode voltage incompatibility problem is to level shift the incoming signal toward ground using resistive means. This, however, adds undue power dissipation by the resistive elements. Another drawback is the bandwidth reduction due to the resistive elements interacting with the parasitics of the given load capacitance. Furthermore, the shifted voltage for the incoming voltage is determined necessarily by the input common mode voltage and for that reason cannot be well controlled. Finally, the resistive level shifting of the incoming common mode voltage means that the desired signal level is necessarily attenuated at input (by the resistive elements' voltage divider ratio). Such signal attenuation is undesirable, especially in case of a long line, since the signal may already be greatly degraded as it is by the line channel.

There is therefore a need for an interface approach whereby compatibility between an incoming high level common mode voltage signal and a receiver stage with heightened sensitivity to such high voltage levels may be preserved, with minimal attenuation of the incoming signal and minimal reduction in signal bandwidth.

SUMMARY OF THE INVENTION

It is an object of the present invention to provide an interface for preserving compatibility between an incoming signal and a receiver stage with heightened sensitivity to the voltage levels of the incoming signal, with minimal attenuation of the incoming signal and minimal reduction in signal bandwidth.

It is another object of the present invention to provide an on-chip serial interface for high speed differential data transfer between circuits which accomplishes a level shifting of the incoming common mode voltage to a level tolerable to highly sensitive devices of the receiving circuit with minimal attenuation of the incoming signal and minimal reduction in signal bandwidth.

It is a further object of the present invention to provide a serial interface operable to reduce a common mode voltage of a differential input data signal to a level tolerable to thin oxide transistor devices of the receiving circuit by selective actuation of a switched capacitive segment disposed in each differential signal path.

These and other objects are attained in a system formed in accordance with the present invention for voltage level translation in a serial data interface between transmitting and receiving circuits. The system includes an interface unit defining at least one signal path to the receiving circuit for an incoming signal transmitted by the transmitting circuit. The system also includes a voltage sensing unit sensing an incoming voltage level of the incoming signal in the signal path, as well as at least one switched capacitive segment disposed in the signal path. The switched capacitive segment is selectively switched between alternative operational configurations to translate the incoming signal in voltage to a preselected compatible level for the receiving circuit.

The switched capacitive segment includes a first capacitive device disposed in the signal path, and a second capacitive device. The second capacitive device in one operational configuration is coupled in parallel to the first capacitive device, and in the other operational configuration is decoupled from the first capacitive device to be coupled between a first reference voltage node at the incoming signal level and a second voltage reference node offset by a predetermined voltage shift therefrom. The incoming signal is thereby translated in voltage by the predetermined voltage shift for safe transmission to the receiving circuit.

In certain exemplary embodiments of the present invention, the system's interface unit defines a differential pair of signal paths, and the system further comprises a pair of the switched capacitive segments, each disposed in one of the differentially paired signal paths. In certain applications of such exemplary embodiments, the second voltage reference node of each switched capacitive segment is coupled to a correction signal generated by a differential offset correction circuit. The predetermined voltage shift applied in each said signal path is then selectively set responsive to the differential offset correction circuit.

A method formed in accordance with the present invention for voltage level translation in a serial data interface between transmitting and receiving circuits includes establishing at least one signal path to the receiving circuit for an incoming signal transmitted by the transmitting circuit. The method further includes sensing an incoming voltage level of the incoming signal in the signal path, and providing at least one switched capacitive segment in such signal path. The method also includes selectively switching the switched capacitive segment between alternative operational configurations so as to translate the incoming signal in voltage to a preselected compatible level for the receiving circuit.

In each switched capacitive segment a first capacitive device is maintained in the signal path. In one operational configuration, a second capacitive device is selectively coupled in parallel to the first capacitive device, while in the other operational configuration the second capacitive device is coupled between a first reference voltage node at the incoming signal level and a second voltage reference node offset by a predetermined voltage shift therefrom. The second capacitive device in the other operational configuration is decoupled from said first capacitive device. The incoming signal is thereby translated in voltage by the predetermined voltage shift for transmission to the receiving circuit.

In certain exemplary embodiments of the present invention, a differential pair of the signal paths is defined. A pair of the switched capacitive segments is provided, with one switched capacitive segment being disposed in each of the differentially paired signal paths. In certain applications of such exemplary embodiments, the method provides for the second voltage reference node of each switched capacitive segment to be coupled to a correction signal generated by a differential offset correction circuit, such that the predetermined voltage shift in each said signal path is selectively set responsive thereto.

DESCRIPTION OF THE PREFERRED EMBODIMENTS

In broad concept, the subject system and method provide a voltage level shifting circuit interface to preserve operational compatibility between transmitting and receiving integrated circuits. A system realized in accordance with one exemplary embodiment of the present invention employs a switched capacitor technique to translate the DC voltage level of an incoming signal in a controlled manner to a desired level. In the particular example of serial transmission of a signal through differentially paired lines, the system operates to level shift an incoming differential signal's common mode voltage to a desired level, and does so without appreciable attenuation of the signal "riding" on the incoming common mode voltage, or any reduction in the prevailing signal bandwidth.

In an exemplary embodiment, the system provides a serial interface for high speed differential data transfer between transmitting and receiving integrated circuits which may not otherwise be compatible in the common mode voltage levels they may safely support. The system provides the required shift of common mode voltage to a level safe for the receiving circuit. The shifted level is preferably defined by the outputs of a differential offset correction unit for the receiving circuit.

In accordance with one aspect of the present invention, the system ensures that the common mode voltage of the input is not high enough to harm any thin gate oxide transistor devices employed in the receiving circuit, yet is of sufficient level to reliably drive that circuit in the intended manner. The system employs switched capacitive means which effectively enable the passage of signal components having frequencies down to and even including DC.

Figure 1:
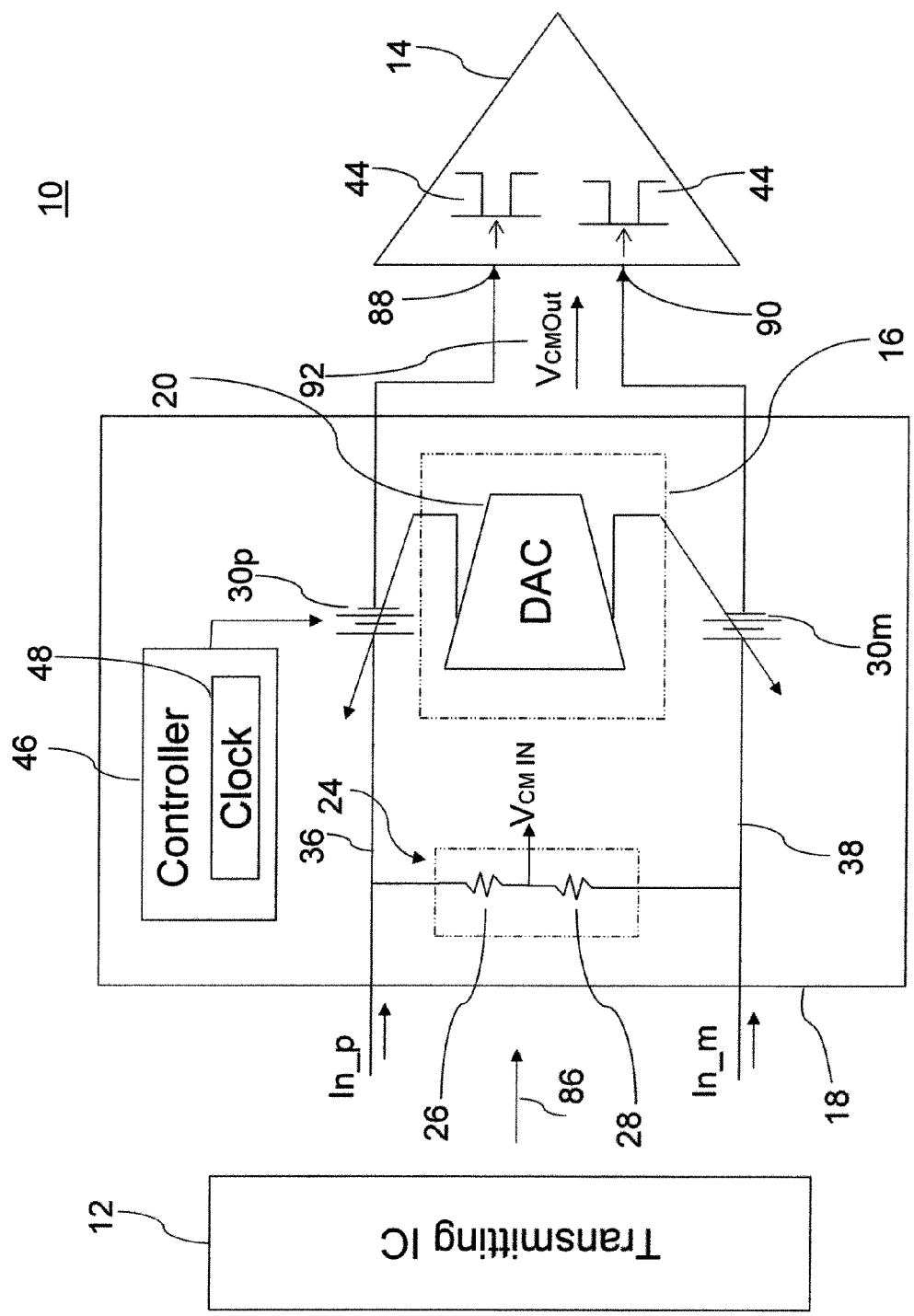
FIG. 1 is a block-diagram of the transmission circuit illustrating a common mode voltage level translation interface in conjunction with an offset correction loop in accordance with one exemplary embodiment of the present invention.

Referring to FIG. 1, a system 10 formed in accordance with an exemplary embodiment of the present invention is disposed as an interface between a transmitting circuit 12 and a receiving circuit 14 to facilitate high speed serial differential data transfer therebetween. Preferably, the system 10 is formed on-chip, as part of a circuit unit or subsystem that is typically provided already with the given receiving circuit 14.

For example, in circuits receiving signals through differentially paired lines, the difference of the lines' output currents generally depend on the difference of their input voltages. If there is no difference in the input voltages, a null difference in the output currents should ideally occur, as a result. Due to non-ideal conditions, this is usually not the case in actual practice. Factors such as defects in component matching defects and the like leave the lines sufficiently imbalanced that the paired lines are invariably characterized by some non-zero DC offset voltage, the input voltage necessary for a null output to be generated. When this DC offset voltage is present on the signal lines, it is potentially amplified by direct coupled amplifiers, thereby distorting the signal being processed or even saturating the amplifiers' output at their supply limits and rendering them inoperable. Consequently, a feedback differential offset correction loop or other such measures are often used to apply a suitable compensation voltage between the paired lines at the input.

System 10 is preferably incorporated in the illustrated embodiment as part of the differential offset correction unit 16 suitably employed with the given receiving circuit 14. System 10 may be implemented on-chip with this differential offset correction unit 16, so that the number of external off-chip components may be minimized.

As schematically shown in FIG. 1, system 10 includes a common mode voltage level translation interface unit 18 operably coupled to the differential offset correction unit 16. Interface unit 18 includes a pair of switched capacitive segments 30p, 30m respectively disposed in the paired lines 36, 38. Each switched capacitive segment 30p, 30m, detailed in following paragraphs, operates responsive to an output of a digital-to-analog converter 20 employed within the differential offset correction unit 16 to impose a variable drop in voltage thereacross. The voltage levels of the signals on the paired lines 36, 38 will undergo a sufficient shift to present a translated common mode voltage VcmT at the input of the receiving circuit 14. The switched capacitive segments 30p, 30m operate in this regard much as a battery varied in voltage responsive to the DAC 20, as shown.

Level translation interface unit 18 further includes a common mode voltage sensing unit 24 to sense the common mode voltage of the incoming signal on lines 36, 38. Unit 24 is formed in the embodiment shown as a voltage divider having balanced resistors 26, 28 of equal resistance R. Vcm In, the average voltage on the paired lines 36, 38, is then tapped from the point between the resistors 26, 28.

The switching in each of the switched capactive segments 30p, 30m is controlled by a controller 46. Preferably, controller 46 generates phase-offset versions of a reference clock generated at block 48 to synchronize the switching of capacitive elements within the segments 30p, 30m in suitable manner.

Figure 2:
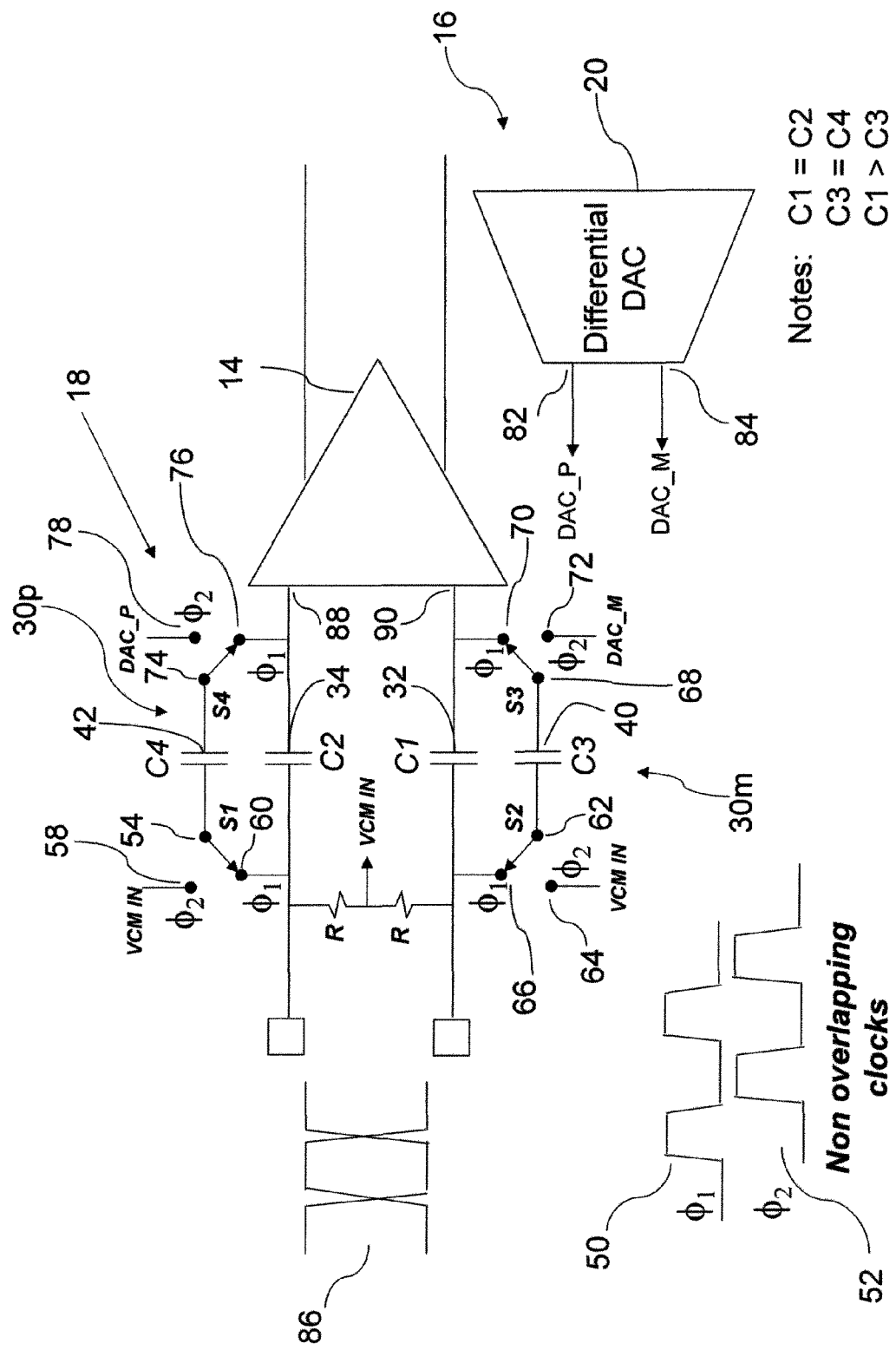
FIG. 2 is a block diagram illustrating in greater detail certain portions of the embodiment illustrated in FIG. 1.

Referring to more detailed schematic of FIG. 2, system 10 is configured in the embodiment shown for high speed differential data transfer between a transmitting circuit 12 and receiving circuit 14. The transmitting circuit 12 may provide a differential digital bit stream having an input common mode voltage Vcm In at a level which exceeds the maximum voltage level that the receiving circuit 14 formed with low voltage high speed transistor devices may safely accommodate.

The switched capacitive segments 30p, 30m of interface unit 18 are disposed to established alternatively switched first and second configurations between the input lines 38, 36 and input terminals 88, 90. Segment 30p includes a first capacitor 34 connected between input line 38 and an input terminal 88 of the receiving circuit 14. Segment 30p also includes a second capacitor 42 which, in a first configuration selected responsive to a first clock signal Φ1, is coupled at nodes 60, 76 in parallel interconnection to the first capacitor 34 by switches 51, S4. In a second configuration selected responsive to a second clock signal Φ2, the second capacitor 42 is decoupled from its parallel interconnection with the first capacitor 34 and alternatively coupled across nodes 58, 78 which respectively receive the sensed voltage Vcm In and a differential offset correction voltage DAC_P provided by DAC 20.

Segment 30m likewise includes a first capacitor 32 connected between input line 36 and an input terminal 90 of the receiving circuit 14. Segment 30m also includes a second capacitor 40 which, in a first configuration selected responsive to the first clock signal Φ1, is coupled at nodes 66, 70 in parallel interconnection to the first capacitor 32 by switches S2, S3. In a second configuration selected responsive to the second clock signal Φ2, the second capacitor 40 is decoupled from its parallel interconnection with the first capacitor 32 and alternatively coupled across nodes 64, 72 which respectively receive the sensed voltage Vcm In and a differential offset correction voltage DAC_M provided by DAC 20.

The first capacitors 32, 34 of the switched capacitive segments 30m, 30p are of equal capacitance C1 and C2, while the segments' second capacitors 40, 42 are of equal capacitance C2 and C4. The first capacitors 32, 34 are disposed in respective signal paths 36 and 38 of the transmission channel, while the second capacitors 40, 42 are disposed off the signal paths 36, 38. Preferably, the first capacitance C1, C2 in each of the segments 30m, 30p is considerably greater in value than the second capacitance C3, C4.

As mentioned, switches S1, S2, S3, and S4, best shown in FIG. 2, are controlled by unit 46 which includes a clock generator 48 which generates non-overlapping clock signals 50, 52 of phases Φ1, Φ2. Switch S1 is preferably a high voltage switching device coupled to terminal 54 of the second capacitor 42 to be switchable responsive to clock signals 50, 52 between the high voltage node 58 and terminal 60 of the first capacitor 34 in segment 30p. Switch S2 is also a high voltage switching device, and is coupled to terminal 62 of the second capacitor 40 to be switchable responsive to clock signals 50, 52 between the high voltage node 64 and terminal 66 of the first capacitor 32 in segment 30m.

Switch S3 is a low voltage switching device coupled to terminal 68 of the second capacitor 40 to be switchable responsive to clock signals 50, 52 between terminal 70 of the first capacitor 32 and the desired referenced voltage node 72 in segment 30m. The switch S4 is also a low voltage switching device, and is coupled to terminal 74 of the second capacitor 42 to be switchable responsive to clock signals 50, 52 between terminal 76 of the first capacitor 34 and the desired reference voltage node 78 in segment 30p.

The differential digital-to-analog converter (DAC) 20 of differential offset correction unit 16 generates at its paired outputs 82, 84 voltage signals DAC_P, DAC_M which not only serve offset compensation purposes for the receiving circuit 14, but also define the common mode voltage level VcmT to which the incoming Vcm In is to be translated. Reference voltages DAC_P, DAC_M thus represent the sufficiently low voltage levels desired for safe delivery of signals to the differential receiving circuit 14.

In operation, when a high speed differential input data signal 86 generated by the transmitting circuit 12, two components of the signal, in_p and in_m (FIG. 1) are applied on the differential lines 38, 36. The signal components ride on the high incoming common mode voltage level Vcm In. Depending on the application, this may be at be at typical ranges of 1.8V-3.3V or even higher, which cannot be tolerated by the low voltage high speed thin oxide transistor devices 44 in the differential receiving circuit 14. Level translating interface unit 18 operates as follows to the shift the high common mode voltage level Vcm In to a lower common mode voltage level VcmT and provide the needed compatibility.

Vcm In is sensed at the voltage divider sensor 24. The sensed Vcm In is applied at the high voltage nodes 58, 64 of the switched capacitive segments 30p, 30m, while the desired input voltage levels DAC_P, DAC_M provided by the differential DAC 20 are applied at the nodes 78, 72 of the segments 30p, 30m. In this regard, if the outputs of the differential DAC 20 are equal, e.g., DAC_P=DAC_M, the equal voltage becomes the translated common mode voltage VcmT applied at the receiving circuit 14. On the other hand, if the DAC output voltages DAC_P, DAC_M are not equal, the difference therebetween becomes the offset voltage and is added to the receiving circuit input terminals 88, 90 as part of the offset correction routine, their average voltage defining Vcm T.

Figure 3A:
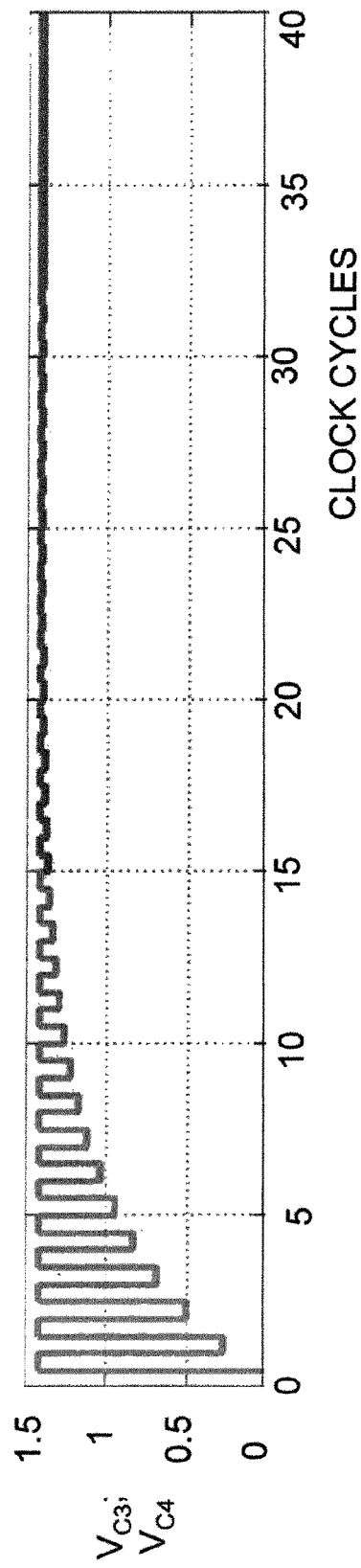
FIGS. 3A-3B are waveform diagrams illustrating the voltages established across respective capacitors of each switched capacitive segment in the embodiment of FIG. 1 in one example of system operation.
Figure 3B:
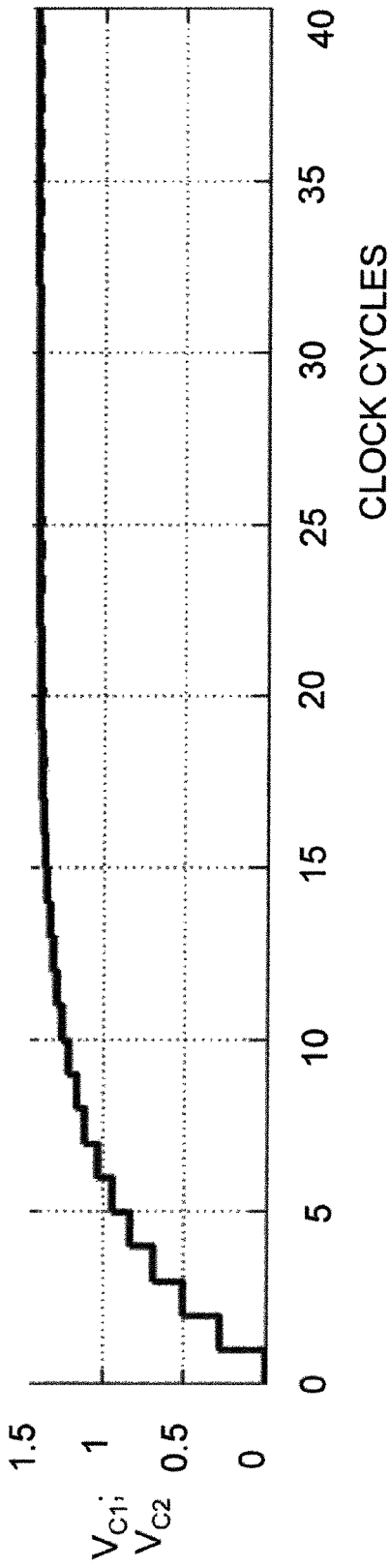
Figure 4A:
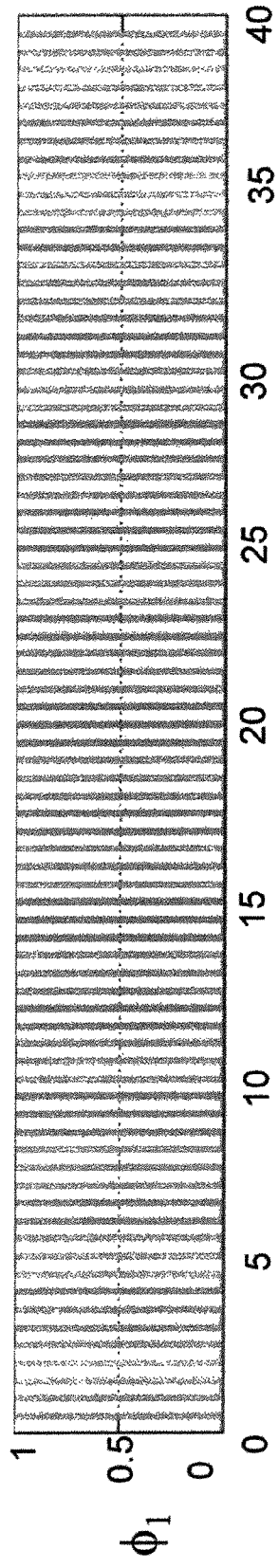
FIGS. 4A-4B are waveform diagrams illustrating non-overlapping clock signals of phase $\phi 1$ and $\phi 2$ for controlling switches in the embodiment of FIG. 1; and, FIG. 5 is a waveform diagram of a level translated common mode voltage obtained upon repeated cycles of system operation in the embodiment of FIG. 1.
Figure 4B:
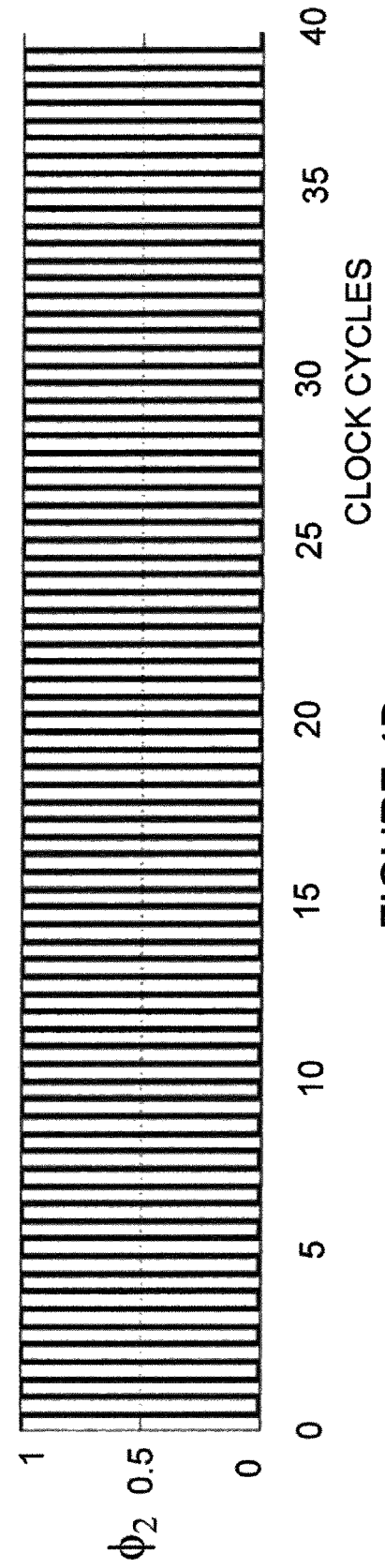

With reference to FIGS. 3A-3B and 4A-4B, the non-overlapping clock signals 50, 52 control the switches S1-S4 to selectively set the switched capacitive segments 30p, 30m into their alternative first and second operational configurations. The first configuration establishes a sampling mode of operation, whereby the clock signal 52 of phase φ2, such as illustrated in FIG. 4B, drives switches 51, S4, and S2, S3 to connect second capacitor 42 of segment 30p to the power nodes 58 and 78, and second capacitor 40 of segment 30m to the power nodes 64 and 72. Over repeated cycles of this sampling mode of operation, the voltage difference between Vcm In and DAC_P is 'sampled' by the second capacitor 42, and the voltage difference between Vcm In and DAC_M is 'sampled' by the second capacitor 40. That is, the second capacitor 42 is incrementally charged to the sampled voltage difference between Vcm In and DAC_P over repeated cycles of operation in the sampling mode, while the second capacitor 40 is incrementally charged in much the same manner to the sampled voltage difference between Vcm In and DAC_M.

The voltage across each of these second capacitors 40, 42 during this sampling mode of operation is represented by the waveform illustrated in FIG. 3A. Because this process involves the redistribution of charge from one capacitive element to another through low impedance switching elements, rapid voltage transitions occur. The time scale for the illustrated waveform is such that the rapid voltage transitions appear as if to occur instantaneously, but one skilled in the art will readily recognize this to be due to compressed scaling, and that the transitions necessarily occur across the capacitive elements necessarily over a non-zero time period.

The second configuration establishes an accumulation mode of operation, whereby the clock signal 50 of phase φ1, such as illustrated in FIG. 4A, drives switches S1-S4 to connect the second capacitor 42 in parallel to the first capacitor 34 in capacitive segment 30p, and the second capacitor 40 in parallel to the first capacitor 32 in capacitive segment 30m. Preferably, the first capacitors 34, 32 are much greater in capacitance than the second capacitors 42, 40, such that over successive cycles of accumulation mode operation, the charged second capacitors 42, 40 serve much like batteries. The first capacitors 34, 32 are thus charged until the voltages across them match the sampled voltages across their corresponding second capacitors 42, 40.

The voltage across each of the first capacitors 34, 32 during this sampling mode of operation is represented by the waveform illustrated in FIG. 3B. Again, the voltage transitions are sufficiently rapid that they appear seemingly instantaneous, though they actually occur over a non-zero time period.

Figure 5:
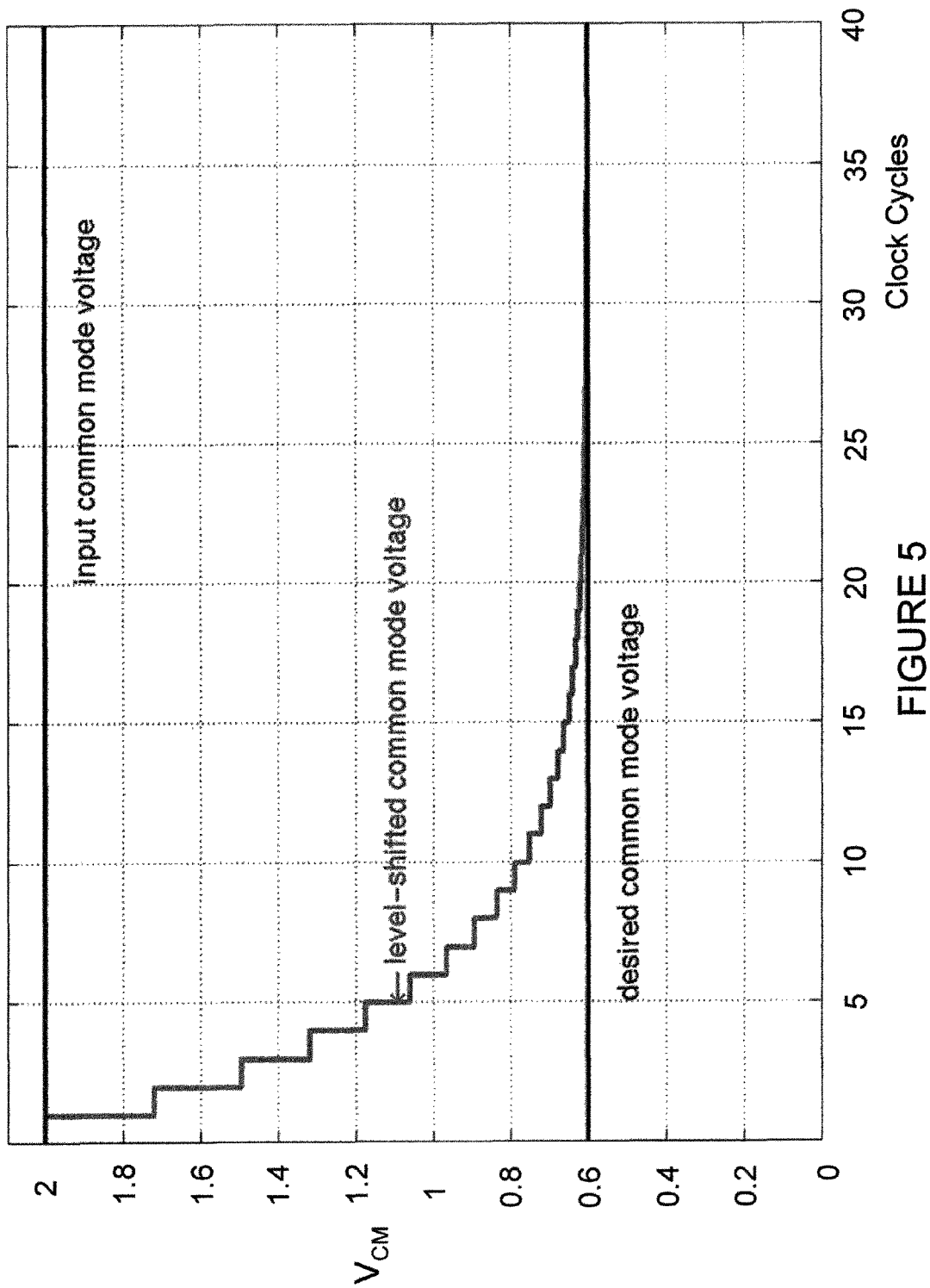

The successive cycles of intermittent sampling and accumulation mode operations occur at a predetermined clock frequency, as illustrated in FIGS. 3A-3B, in conjunction with FIGS. 4A-4B. Once the voltage across each of the first capacitors 32, 34 settles to the sampled voltage value for the given signal line (FIG. 3B), the input common mode voltage is translated in each signal line by the line's sampled voltage amount. The receiving circuit 14 is presented at its input with signal lines at the desired common mode voltage VcmT defined by DAC_P and DAC_M. The receiving circuit 14 is then ready to safely receive data through the paired signal lines 36, 38. In the example illustrated in FIG. 5, the incoming Vcm In of approximately 2V is translated to a desired common mode voltage level (of, for example, 0.6V in the example illustrated) which is tolerable to the low voltage high speed transistor devices in receiver circuit 14.

Preferably, offset correction for common mode voltage VcmT may be effected by varying DAC_P and DAC_M levels, one relative the other. In the illustrated example of operation, the voltages across corresponding first capacitors 32, 34 of the segments 30p and 30m, and across their corresponding second capacitors 40, 42, are substantially identical because no offset correction is applied. The DAC_P and DAC_M levels in this case are substantially equal. Where these levels are varied to apply a measure of offset correction, the respective voltages of corresponding first and second capacitors would be accordingly offset.

When the first capacitors 34, 32 of the capacitive segments 30p, 30m become fully charged, they remain at their fully charged voltages and serve effectively as voltage level shifters. So long as the load (receiver circuit 14) is of sufficiently high impedance, even DC voltage levels may be shifted and passed to the load (with no current draw). That is, the common mode level may be reliably shifted and passed through to the receiver even for differential DC voltages levels. Serial data links which heretofore proved problematic for having to pass extensive strings of 1's and 0's may be suitably accommodated in accordance with the present invention. Data down to DC—or an infinite string of consecutive 1's or 0's—may be reliably passed. Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particular applications of elements may be reversed or interposed, all without departing from the spirit or scope of the invention as defined in the appended claims.

What is claimed is:

1. A system for voltage level translation in a serial data interface between transmitting and receiving circuits, comprising:
    an interface unit defining at least one signal path to the receiving circuit for an incoming signal transmitted by the transmitting circuit;
    a voltage sensing unit sensing an incoming voltage level of the incoming signal in said signal path; and,
    at least one switched capacitive segment disposed in said signal path, said switched capacitive segment being selectively switched between alternative operational configurations to translate the incoming signal in voltage to a preselected compatible level for the receiving circuit, said switched capacitive segment including:
        a first capacitive device disposed in said signal path; and,
        a second capacitive device in one of said operational configurations being coupled in parallel to said first capacitive device, said second capacitive device in the other of said operational configurations being decoupled from said first capacitive device to be coupled between a first reference voltage node at said incoming signal level and a second voltage reference node offset by a predetermined voltage shift therefrom;
    whereby the incoming signal is translated in voltage by said predetermined voltage shift for transmission to the receiving circuit.

2. The system as recited in claim 1, wherein said interface unit defines a differential pair of said signal paths, said system further comprising a pair of said switched capacitive segments each disposed in one of said differentially paired signal paths.

3. The system as recited in claim 2, wherein said second voltage reference node of each said switched capacitive segment is coupled to a correction signal generated by a differential offset correction circuit, said predetermined voltage shift in each said signal path being thereby selectively set responsive to said differential offset correction circuit.

4. The system as recited in claim 2, wherein said voltage sensing unit includes a voltage divider defined by a pair of balanced resistive devices coupled between said differentially paired signal paths, said voltage sensing unit tapping a voltage at a node between said balanced resistive devices.

5. The system as recited in claim 1, wherein said switched capacitive segment is selectively switched between said alternative operational configurations responsive to first and second clock signals offset in phase to be non-overlapping.

6. The system as recited in claim 1, wherein said first capacitive device of said switched capacitive segment is substantially greater in capacitance than said second capacitive device.

7. A serial interface for high speed differential serial data transmission on a pair of signal paths between a transmitting circuit and a receiving circuit, said serial interface comprising:
a common mode voltage (Vcm) level shifting circuit coupled on-chip between said transmitting and receiving circuits and operating intermittently in a first mode of operation and in a second mode of operation, said Vcm level shifting circuit including:
first and second inputs receiving therebetween an incoming differential data signal, said incoming differential data signal having an incoming Vcm level,
a voltage divider coupled to said first and second inputs of said Vcm level shifting circuit for sensing the incoming Vcm level of the incoming differential data signal,
first in-signal-path capacitors, $C_1$ and $C_2$, each coupled in a respective one of said pair of signal paths between said transmitting and receiving circuits, each of said $C_1$ and $C_2$ having a first terminal and a second terminal,
second off-signal-path capacitors, $C_3$ and $C_4$, each having a third terminal and a fourth terminal,
a high voltage node receiving said Vcm level measured at said voltage divider, and
first and second desired voltage nodes, each of said first and second desired voltage nodes respectively at a predetermined pair of desired voltages, and
a controller selectively switching said level shifting circuit between said first and second modes of operation,
wherein, each of said off-signal-path capacitors, $C_3$ and $C_4$, in said first mode of operation samples a difference voltage between said Vcm level on said high voltage node and a respective one of said first and second desired voltage nodes, and
wherein, each of said off-signal-path capacitors, $C_3$ and $C_4$, in said second mode of operation is switched in parallel to a respective one of said in-signal-path capacitors, $C_1$ and $C_2$, whereby each of said in-signal-path capacitors incrementally charges to said sampled difference voltage across a corresponding one of said off-signal-path capacitors.

8. The serial interface of claim 7, wherein said controller includes a clock circuit generating first and second non-overlapping clock signals to switch said level switching circuit between said first and second modes of operation.

9. The serial interface of claim 8, further comprising:
first and second high voltage switches, $S_1$ and $S_2$, each coupled to said third terminal of a respective one of said off-signal-path capacitors, $C_3$ and $C_4$, and switchable between said first terminal of a respective one of said in-signal-path capacitors, $C_1$ and $C_2$, and said high voltage node, and
first and second low voltage switches, $S_3$ and $S_4$, each coupled to said fourth terminal of a respective one of said off-signal-path capacitors, $C_3$ and $C_4$, and switchable between said second terminal of a respective one of said in-signal-path capacitors, $C_1$ and $C_2$, and a respective one of said first and second desired voltage nodes.

10. The serial interface of claim 9, further comprising a differential offset correction digital-to-analog converter (DAC), said DAC generating said pair of desired voltages, DAC_P and DAC_M.

11. The serial interface of claim 10, wherein said in-signal-path capacitors, $C_1$ and $C_2$, are substantially greater in capacitance than said off-signal-path capacitors, $C_3$ and $C_4$.

12. A system for common mode voltage level translation in a serial differential data interface between transmitting and receiving circuits, comprising:
an interface unit defining differentially paired signal paths to the receiving circuit for an incoming differential signal transmitted by the transmitting circuit;
a voltage sensing unit coupled to sense an incoming common mode voltage level, Vcm In, of the incoming differential signal in said differentially paired signal paths; and,
a pair of switched capacitive segments respectively disposed in said signal path, said switched capacitive segment being selectively switched between alternative operational configurations responsive to first and second clock signals offset in phase to be non-overlapping, said switched capacitive segments translating Vcm In of the incoming differential signal in to a preselected common mode voltage level compatible with the receiving circuit, each of said switched capacitive segments including:
a first capacitive device disposed in one of said signal paths; and,
a second capacitive device in one of said operational configurations being coupled in parallel to said first capacitive device, said second capacitive device in the other of said operational configurations being decoupled from said first capacitive device to be coupled between a first reference voltage node at said incoming signal level and a second voltage reference node offset by a predetermined voltage shift therefrom;
whereby a component of the incoming differential signal in said signal path is translated in voltage by said predetermined voltage shift for transmission to a corresponding input of the receiving circuit.

13. The system as recited in claim 12, wherein said second voltage reference node of each said switched capacitive segment is coupled to a correction signal generated by a differential offset correction circuit, said predetermined voltage shift in each said signal path being thereby selectively set responsive to said differential offset correction circuit.

14. The system as recited in claim 13, wherein said voltage sensing unit includes a voltage divider defined by a pair of balanced resistive devices coupled between said differentially paired signal paths, said voltage sensing unit tapping a voltage at a node between said balanced resistive devices.

15. The system as recited in claim 14, wherein said first capacitive device of each said switched capacitive segment is substantially greater in capacitance than said second capacitive device.

16. A method for voltage level translation in a serial data interface between transmitting and receiving circuits, comprising:
- establishing at least one signal path to the receiving circuit for an incoming signal transmitted by the transmitting circuit;
- sensing an incoming voltage level of the incoming signal in said signal path; and,
- providing at least one switched capacitive segment in said signal path, selectively switching said switched capacitive segment between alternative operational configurations to translate the incoming signal in voltage to a preselected compatible level for the receiving circuit, in each switched capacitive segment:
  - maintaining a first capacitive device in said signal path; and,
  - in one of said operational configurations selectively coupling a second capacitive device in parallel to said first capacitive device, in the other of said operational configurations decoupling said second capacitive device from said first capacitive device to be alternatively coupled between a first reference voltage node at said incoming signal level and a second voltage reference node offset by a predetermined voltage shift therefrom;
- whereby the incoming signal is translated in voltage by said predetermined voltage shift for transmission to the receiving circuit.

17. The method as recited in claim 16, wherein a differential pair of said signal paths is defined, a pair of said switched capacitive segments being provided with each said switched capacitive segment disposed in one of said differentially paired signal paths.

18. The method as recited in claim 17, wherein said second voltage reference node of each said switched capacitive segment is coupled to a correction signal generated by a differential offset correction circuit, said predetermined voltage shift in each said signal path being thereby selectively set responsive to said differential offset correction circuit.

19. The method as recited in claim 17, wherein a voltage divider is established by coupling a pair of balanced resistive devices between said differentially paired signal paths, a voltage being tapped at a node between said balanced resistive devices to sense a common mode voltage level of the incoming signal.

20. The method as recited in claim 16, wherein said switched capacitive segment is selectively switched between said alternative operational configurations responsive to first and second clock signals offset in phase to be non-overlapping.

21. The method as recited in claim 16, wherein said first capacitive device of said switched capacitive segment is substantially greater in capacitance than said second capacitive device.

* * * * *